Figure 1:
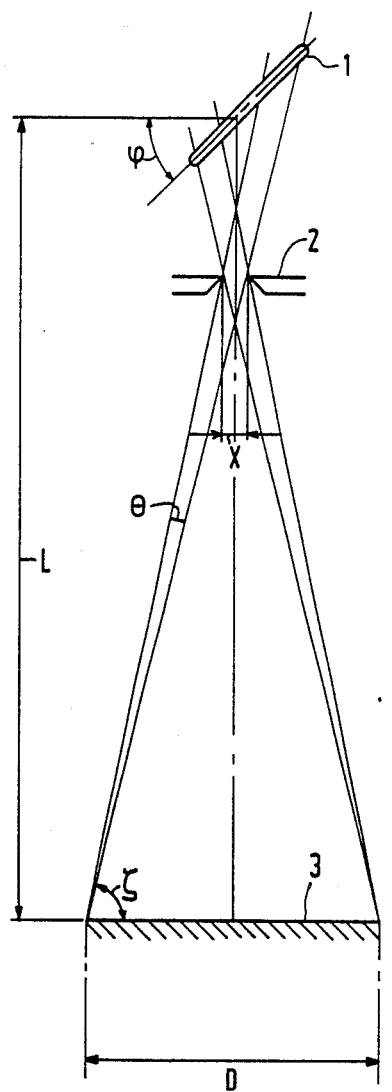

United States Patent [19]

Stormberg et al.

[11] Patent Number: 4,899,355

[45] Date of Patent: Feb. 6, 1990

[54] X-RAY LITHOGRAPHY SYSTEM

[75] Inventors: Hans-Peter Stormberg, Stolberg, Fed. Rep. of Germany; Yoshio Watanabe, Tokyo, Japan

[73] Assignees: U.S. Philips Corporation, New York, N.Y.; Hitachi Ltd.

[21] Appl. No.: 215,698

[22] Filed: Jul. 5, 1988

[30] Foreign Application Priority Data

Jul. 10, 1987 [JP] Japan ................................ 62-170958

[51] Int. Cl.$^4$ .................................................. G21K 5/00
[52] U.S. Cl. ......................................... 378/34; 378/122
[58] Field of Search ................................... 378/34, 122

[56] References Cited

U.S. PATENT DOCUMENTS 4,771,447  9/1988  Saitoh ................................. 378/34

Primary Examiner—Craig E. Church

[57] ABSTRACT

An X-ray lithography system comprises an X-ray source which forms a plasma, a band slit located between the X-ray source and a resist film such that a short slit side is parallel with a central axis of a plasma column, the long slit side being tilted with respect to said central plasma column axis.

2 Claims, 1 Drawing Sheet

X-RAY LITHOGRAPHY SYSTEM

The present invention relates to an X-ray lithography system used for the manufacture of semiconductor devices, and more particularly to an X-ray lithography system which is suited when use is made of an X-ray source having the shape of a column.

BACKGROUND OF THE INVENTION

A known X-ray source used for X-ray lithography can be represented by a plasma X-ray source which utilizes the Z pinch established by the discharge of a large current. Owing to the magnetic compression generated in the radial direction, the plasma X-ray source is formed in the shape of a column which is about 1 mm in diameter and 20 to 20 mm in length.

In semiconductor lithography, since fine patterns must be correctly transferred onto the resist, the X-ray that is used must be very close to a parallel beam. In general, therefore, the material to be irradiated is installed on an extension in the axial direction of the column source of light that looks like a point source of light when the light source is viewed from the surface of the resist.

This arrangement, however, has defects as described below when compared with the case where the material to be irradiated is installed on an extension in the radial direction of the column source of light.

In the Z-pinch plasma, a strong compressive magnetic field exists in the radial direction, and high energetic particles in the plasma are confined in the radial direction. However, since the compressive magnetic field does not exist in the axial direction, the high energetic particles are not confined in this direction but are allowed to jet in the axial direction in the form of a shock wave. When the material to be irradiated is installed in the axial direction, therefore, the high energetic particles are introduced together with the X-ray to destroy a thin beryllium disc which constitutes an X-ray pass-through window.

The Z-pinch plasma usually exhibits a large absorption, and the column source of light exhibits a nearly uniform surface intensity. Therefore, depending upon whether the surface of the resist is placed in the axial direction of the column source of light or in the radial direction thereof, the photon flux radiated in the axial direction increases by an area ratio of the source of light as viewed from the surface of the resist.

The above-mentioned problem does not develop if the surface of the resist is placed in the radial direction of the column surface of light. Deviation of the ray of light from the parallel beam that develops when the surface of the resist is placed in the radial direction of the column source of light, can be compensated by placing a band slit as disclosed in Japanese Patent Laid-Open No. 14113/1986. In this case, the following advantages are obtained compared with the case where the surface of the resist is placed in the axial direction of the source of light.

A thin beryllium disc is usually placed between the source of light and the surface of the resist in order to permit the transmission of X-rays only, but to interrupt light of other wavelengths, as well as to maintain a pressure difference between space of discharge and space where the material to be irradiated is placed. The surface of the resist usually has an area of 30 mm square. When the surface of the resist is placed in the axial direction, therefore, a disc having an effective diameter of about 11 mm is obtained if the beryllium disc that is a window material is placed at a position of ¼ the distance between the source of light and the surface of the resist as measured from the source of light; i.e., the disc having this diameter must be capable of withstanding the pressure difference that includes the shock wave. On the other hand, when the exposure is to be effected in the radial direction of the column source of light via a band slit, the beryllium disc can be placed on the band slit. In this case, the strength of the beryllium disc may be considered relying upon a narrow slit width (about 0.9 mm though it may vary depending upon the conditions). Being compounded by the fact that the shock wave is not transmitted in the radial direction, the thickness of the beryllium plate can be sufficiently reduced when the exposure is to be effected in the radial direction. This offers a great advantage when there is used a source of light of a long wavelength (e.g. a wave length of 12 angstroms in a neon gas environment that can be absorbed well by the beryllium disc.

The photon flux obtained on the surface of the resist is cut off by the band slit and decreases greatly, which, however, is still about 1.5 times as great as the photon flux in the axial direction.

PROBLEMS TO BE SOLVED BY THE INVENTION

Described below are problems inherent in the conventional art in which the surface of the resist is placed on an extension of the column source of light in the radial direction thereof, and a band slit is placed therebetween. The photon flux at a given point on the surface of the resist is not the sum of radiation flux from the whole of the column source of light, but is the radiation flux from a corresponding local portion due to the action of the band slit. Therefore, if the intensity distribution of the column source of light is not uniform along the axis thereof, the distribution of luminance on the resist becomes nonuniform in proportion thereto.

There are two kinds of nonuniformities in the intensity distribution along the axis. One stems from unstable pinch plasma, in which the source of light appears like an arrangement of beads. The other stems from the electrode of a pinch column that is asymmetrical in the axial direction, the intensity decreasing from one end toward the other end in the axial direction.

According to the aforementioned conventional art, no consideration has been given in regard to nonuniformity of luminance on the resist film in case when the intensity of the column source of light is not uniform in the axial direction.

The object of the present invention therefore is to provide an X-ray lithography system which is capable of preventing the nonuniformity of luminance from development on the resist film even when the intensity of the column source of light is not uniform in the axial direction.

MEANS FOR SOLVING THE PROBLEMS

The above-mentioned object is accomplished by the system in which a band slit having a finite width is placed between the column source of light and the resist film, and the surface of the resist is provided being tilted relative the axis of the source of light in the radial direction thereof by utilizing the fact that non-uniformity does not develop on the surface of the resist if the source of light has such a length that the interval of non-uniformity of intensity can be seen, the source of light being viewed from the surface of the resist (resist film) via a slit.

ACTIONS

A resist film is placed in the radial direction of a column source of light, and a band slit is placed therebetween, the band slit having a long side at right angles with the axis of the source of light and having a short side in parallel with the axis of the source of light. Even if the column source of light has an increased length, therefore, the ray of light incident on the resist film can be brought close to the parallel beam.

If the column source of light is tilted relative to the resist film under this condition, the length of the column of discharge increases as viewed from the resist film through the band slit. If the interval of nonuniformity in the arrangement of beads is smaller than the length that can be seen, the light is accumulated on the resist film and non-uniformity does not develop. Further, if the slit surface or the resist film is tilted, the luminance on the resist film decreases from one end thereof toward the other end thereof. Therefore, if it is tilted relatively so as to cancel the change of intensity along the axis of the source of light, the luminance on the resist film can be maintained uniform even in case the intensity of the column source of light gradually decreases in the axial direction thereof.

Figure 2:
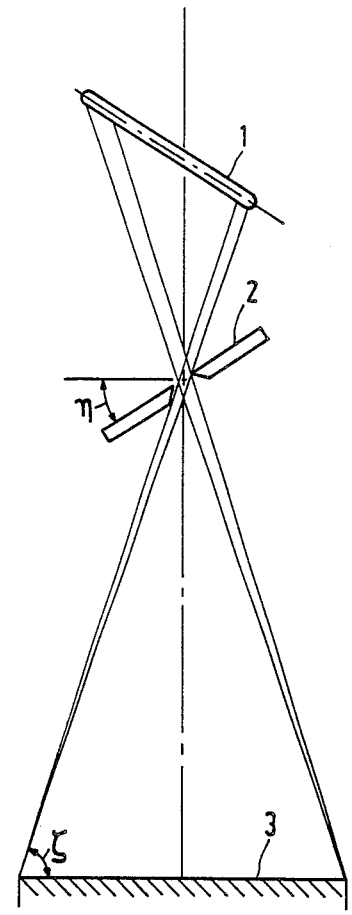

Same embodiments of the invention will be described with reference to the drawing in which FIG. 1 is a diagram illustrating the relationship of arrangement among the source of light, surface of the resist and band slit in the X-ray lithography system according to the present invention; and FIG. 2 is a diagram illustrating the arrangement according to another embodiment of the present invention.

An embodiment of the invention will now be described in conjunction with FIG. 1, wherein reference numeral 1 denotes a plasma column source of light formed by the Z pinch by supplying a pulse-like large current across the electrodes (not shown) to plasmatize the gas, reference numeral 2 denotes a band slit, and 3 denotes the surface of the resist. In the conventional art, the axis of the source of light 1 is in parallel with the surface of the resist. According to the present invention, on the other hand, there exists a relative inclination $\phi$ between the two. The size of the source of light 1 viewed from the surface of the resist 3 is determined by the width x of the band slit 2. The angle $\theta$ for viewing the source of light 1 via the slit 2 gives image transfer accuracy in the lithography irrespective of the inclination $\phi$. An angle $\xi$ subtended by the ray of light passing through the slit 2 and the surface of the resist 3 becomes minimal at an end of the surface of the resist 3. The allowable value of $\xi$ is determined by the image transfer accuracy of lithography, and is generally set to be greater than 85 degrees.

If now the angle $\xi$, is approximately 90 degrees, the source of light 1 is tilted by the angle $\phi$ so that the apparent length of discharge is reduced to a length multiplied by $\cos \phi$ compared with when $\phi=0$. Therefore, even when there has developed nonuniformity like an arrangement of beads (maintaining an interval $\Delta x$), the interval along the axis of nonuniformity of intensity can be reduced to a length that is multiplied by $\cos \phi$. If the reduced interval ($\Delta x \cos\phi$) in the nonuniformity of intensity is shorter than the length ($\theta \cdot L$) of the source of light that is viewed via the slit 2, the intensity is averaged and is uniformalized on the surface of the resist 3.

In a representative example, $\theta \cdot L = 1$ to 2 mm and $\Delta x$ is from about 0.5 to 2 mm. Even in the worst combination, therefore, the angle should be set to $\cos\phi = 0.5$, i.e., should be set to 60 degrees.

In the plasma X-ray source of this type, furthermore, there generally exists absorption, and the surface intensity of the source of light 1 is close to perfect diffusion surface. Therefore, if the angle $\theta$ for viewing the source of light 1 through the slit 2 remains the same, the intensity on the surface of the resist 3 remains constant irrespective of the inclination $\phi$ of the axis of the source of light 1, and the obtained photon flux remains unchanged.

If the angle $\xi$ subtended by the ray of light and the surface of the resist 3 becomes smaller than 90 degrees to some extent, the apparent length of the source of light 1 viewed from the source of the resist 3 through the slit 2 varied depending upon the angle ($\xi + \phi$).

When the interval in the nonuniformity in the arrangement of beads uniformly changes along the axis, the source of light 1 should be so tilted that the angle $\phi$ is oriented in the $-\phi$ direction.

FIG. 2 illustrates another embodiment according to the present invention. What makes this embodiment different from that of FIG. 1 is that the band slit 2 is also tilted by an angle $\eta$ with respect to the surface of the resist 3. This makes it possible to cope with the case where the intensity of the source of light 1 is not constant along the axis. That is, owing to such an arrangement, the effective width of the slit 2 as viewed from the surface of the resist 3 is changed by the angle $\eta$ depending upon the position on the surface of the resist 3.

EFFECTS OF THE INVENTION

According to the structure of the present invention in which the surface of the resist is placed on an extension in the radial direction of the axis of the column source of light and the band slit is placed between the source of light and the surface of the resist, the axis of the source of light is tilted, or the axis of the source of light as well as the slit surface are tilted by a suitable angle with respect to the surface of the resist, so that the intensity can be uniformalized on the surface of the resist even when the intensity is not uniform along the axis of the source of light.

What is claimed is:

1. An X-ray lithography system comprising an X-ray source formed of a linear discharge plasma extending along a first axis, a resist film to be irradiated by the X-ray source, said resist film comprising a surface that is tilted at a predetermined angle of tilt with respect to said first axis, a band slit which is located between said X-ray source and said resist film, said slit having a long side which is parallel to a second axis that is perpendicular to said first axis, wherein the angle of tilt of said resist film surface is of sufficient magnitude that an interval of non-uniformity of said X-ray source seen from a point on said surface is smaller than the length of said X-ray source seen from said point.

2. An X-ray lithography system according to claim 1, wherein said band slit is tilted with respect to said resist film such that each point on said surface of said resist film is irradiated with the same X-ray intensity.

* * * * *